United States Patent [19]

Hornburg

[11] 4,384,260
[45] May 17, 1983

[54] DEVICE FOR SWITCHING ON AND OFF AND ADJUSTING THE VOLUME OF COMMUNICATIONS EQUIPMENT, SUCH AS TRANSCEIVERS

[75] Inventor: Klaus Hornburg, Berlin, Fed. Rep. of Germany

[73] Assignee: Krone GmbH, Berlin, Fed. Rep. of Germany

[21] Appl. No.: 187,759

[22] Filed: Sep. 16, 1980

[30] Foreign Application Priority Data

Sep. 18, 1979 [DE] Fed. Rep. of Germany ....... 2937638

[51] Int. Cl.$^3$ .............................................. H03G 3/30
[52] U.S. Cl. ..................................... 330/129; 330/278; 455/233
[58] Field of Search ............... 330/129, 202, 278, 297; 340/168 R, 168 B; 455/232, 233

[56] References Cited

U.S. PATENT DOCUMENTS 3,098,212  7/1963  Creamer, Jr. .................... 455/233 X
3,890,592  6/1975  Kitamura et al. ............... 455/233 X
4,087,793  5/1978  Lucas .............................. 455/232 X Primary Examiner—James B. Mullins
Attorney, Agent, or Firm—Brown & Martin

[57] ABSTRACT

Improved apparatus for switching on and off and adjusting the volume of communications equipment employs a non-latching button, a delay element for producing a time delay determined by the pressure time on the button, a volume adjusting device for adjusting the amplification of an amplifier and a relay control for turning the amplifier off and on. The button is coupled to both the volume adjusting device and the relay control via the delay element in such a fashion that, depending on the delay time, either a switching or a volume adjustment results. An automatic shutoff can also be provided for shutting off the power supply to the amplifier after the loop current is interrupted.

12 Claims, 2 Drawing Figures

DEVICE FOR SWITCHING ON AND OFF AND ADJUSTING THE VOLUME OF COMMUNICATIONS EQUIPMENT, SUCH AS TRANSCEIVERS

BACKGROUND OF THE INVENTION

This invention relates to an improved device for switching on and off and for adjusting volume in a communications device such as a transceiver.

Prior art devices for this purpose typically utilize a plurality of latching buttons which must be mechanically unlatched. As a consequence, they are relatively complex mechanical systems.

An objective of the present invention is to provide a novel electronic circuit which replaces the complicated mechanical systems of the prior art.

SUMMARY OF THE INVENTION

In accordance with the present invention, an improved apparatus for switching on and off and adjusting the volume of communications equipment employs a non-latching button, a delay element for producing a time delay determined by the pressure time on the button, a volume adjusting device for adjusting the amplification of an amplifier and a relay control for turning the amplifier off and on. The button is coupled to both the volume adjusting device and the relay control via the delay element in such a fashion that, depending on the delay time, either a switching or a volume adjustment results. An automatic shutoff can also be provided for shutting off the power supply to the amplifier after the loop current is interrupted.

BRIEF DESCRIPTION OF THE DRAWINGS

The nature, advantages and various features of the invention will appear more fully upon consideration of the illustrative embodiment now to be described in detail in connection with the accompanying drawings.

In the drawings.

DETAILED DESCRIPTION OF THE DRAWINGS

Figure 1:
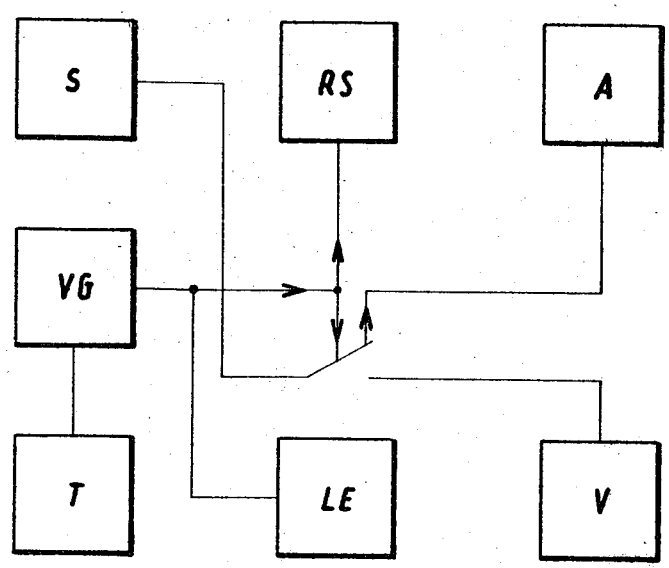
FIG. 1 is a block diagram of a device according to the invention.

Referring to the drawings, FIG. 1 is a block diagram of a device, in accordance with the invention, for switching on, switching off, and adjusting the volume of communications equipment such as transceivers. In essence, the apparatus comprises a non-latching button T, a time delay element VG for producing a time delay determined by the time the button is depressed, an amplifier V, a volume adjusting device LE for controlling the amplification of the amplifier and a relay control RS for switching the amplifier on and off.

The button T is coupled to both the volume adjusting device LE and the relay control RS via the delay element VG in such a fashion that, depending on the delay time produced by depression of the button T, either switching or volume adjustment results.

An automatic shutoff A can be provided for shutting off the power supply S to the amplifier V after the loop current is interrupted.

Figure 2:
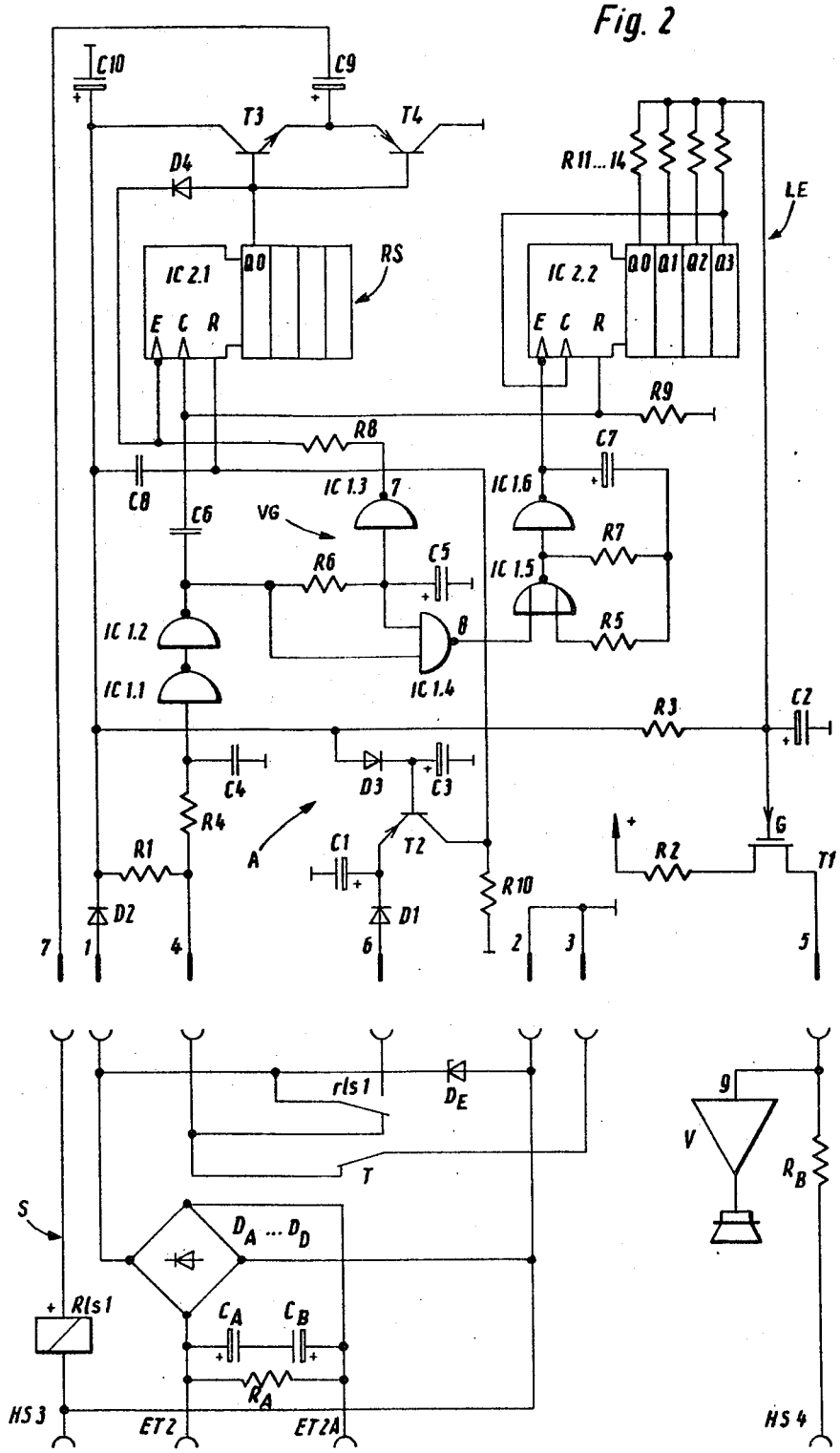
FIG. 2 is a schematic diagram of a preferred electronic circuit for use in the invention.

The structure and operation of a preferred embodiment of such a device is shown in greater detail in the schematic diagram of FIG. 2. As illustrated, relay control RS is composed of a binary counter IC2.1 having an output QO, an enable input E, a reset input R and a clock input C. The output QO is connected to (1) transistors T3 and T4 in a balanced circuit to amplify the current, (2) capacitor C9, (3) bipolar relay Rls1, and (4) diode D4. The diode D4 is connected with enable input E, and capacitor C8 and resistor R10 are connected to the reset input R. Capacitor C6 and inverters IC1.1 and IC1.2 are connected to the clock input C.

In operation, when power supply S is triggered by brief actuation of nonlatching button T, capacitor C10 is charged to a voltage which is a function of the Z voltage of Zener diode DE.

Capacitor C8 is a low-ohmage capacitor and zeros binary counter IC2.1

After capacitor C8 has been charged through resistor R10, reset input R of binary counter IC2.1 is switched to the L potential.

The combination of resistors R1 and R4 and capacitor C4 serves for delayed connection of the first counting pulse (after the reset pulse) serves to debounce non-latching button T, which is known to produce an erroneous pulse as it is activated.

When the voltage at capacitor C4 exceeds the input threshold voltage of inverter IC1.1, the voltage at the output of IC1.2 jumps to H potential providing the first counting pulse to binary counter IC2.1, differentiated by capacitor C6.

Output QO of binary counter IC2.1 then goes to potential H and transistor T3 conducts.

The positive voltage jump, differentiated via capacitor C9, is fed to bipolar relay Rls1, located off the printed-circuit board, causing the relay to become active and release the latch through its contact rls1.

When non-latching button T is pressed briefly a second time, the second counting pulse makes output QO of binary counter IC2.1 acquire L potential. Transistor T4 conducts and, by applying the opposite polarity of capacitor C9, bipolar relay Rls1 switches its contact rls1 back to the resting position. Contact rls1 closes, and power supply S is short-circuited after non-latching button T is released.

Within power supply S, resistor RA, in known fashion, serves to identify the equipment and capacitors CA and CB short-circuit bridge rectifiers DA ... DD with alternating current.

Diode DE limits the operating voltage of this circuit by its value.

Moreover, FIGS. 1 and 2 show that an automatic cutoff mechanism A is provided.

Diodes D1, D2 and D3, capacitors C1 and C3, and transistor T2 return relay Rls1 to the resting position when the handset is hung up. When the handset is hung up, the voltage at the base of transistor T2 becomes negative more rapidly than at the emitter, and the DC voltage stored in capacitor C1 appears at the collector when transistor T2 conducts.

Binary counter IC2.1 receives the reset pulse and output QO assumes L potential, causing relay Rls1 to move to the resting position.

In addition, a delay element VG is provided. If non-latching button T is pressed for longer than the time required to charge capacitor C5 through resistor R6, output 7 goes to L potential because the threshold voltage of inverter IC1.3 has been exceeded.

If a switching-off process was initiated at the beginning when the button T was pressed, a further counting pulse via resistor R8 follows via the enable input E of binary counter IC2.1, which forms an OR link in conjunction with diode D3, which then triggers bipolar relay Rls1 via output QO and transistor T3, switching on power supply S.

Diode D4 delays the counting pulse at enable input E of binary counter IC2.1 when a switching-on process is initiated by starting to press the button T.

According to the invention, each time the button T is pressed for longer than the time it takes for capacitor C5 to charge through resistor R6, a volume adjustment LE is initiated.

Each time pressing the button begins, binary counter IC2.2 is zeroed through capacitor C6 and resistor R9.

After binary counter IC2.2 has been reset and after capacitor C5 has been fully charged, output 8 of NAND gate IC1.4 acquires L potential.

Pulse generator IC1.5 and IC1.6 delivers a square-wave pulse to enable input E of binary counter IC2.2 after the input of IC1.5 has been released, depending on the time constant of resistor R7 and of capacitor C7.

A voltage which is linear and increases stepwise, and is smoothed by capacitor C2 to prevent clicks when the volume changes, appears at the junction of resistors R11, R12, R13 and R14.

This rising voltage at gate G of regulating transistor T1 enables the P channel to reach a higher ohmage. The alternating voltage at input 9 of receiver amplifier V and the volume become greater. The basic volume is set by resistor R2.

Resistor RB is considered the source resistor for control resistor T1.

At the eighth step of binary counter IC2.2, output Q3 goes to H potential.

Binary counter IC2.2 is blocked and thus sets the maximum volume.

Each time the non-latching button T is pressed, the basic volume is adjusted by binary counter IC2.2 being zeroed.

Terminals ET2 and ET2A are added to the FeAp loop in known fashion; this produces series feed. HS3 and HS4 are the connections of the FeAp for the earphones.

The advantages of this invention are manyfold. With but a single button in a simple mechanical arrangement, the user can control both switching on and off and can effect volume adjustment.

While the invention has been described in connection with a small number of specific embodiments, it is to be understood that these are merely illustrative of many other specific embodiments which also utilize the principles of the invention. Thus, numerous and varied devices can be made by those skilled in the art without departing from the spirit and scope of the invention.

What is claimed is:

1. Apparatus for switching on, switching off and adjusting the volume of communications equipment such as transceivers, said apparatus comprising:
    a non-latching button for selectively completing an electrical circuit within said apparatus;
    amplifier means;
    volume control means selectively connected to said amplifier means and adapted to provide continuous substantially linear control of said amplifier means;
    a power supply internal to said apparatus, said non-latching button being coupled to said power supply, said power supply having a source lead and a return terminal;
    means adapted to connect said power supply to an external source of electrical power;
    relay means for connecting said power supply to and disconnect said power supply from said volume control means;
    means for controlling said relay means;
    time delay means connected between said non-latching button and both said relay control means and said volume control means, said time delay having a predetermined timing period; and
    automatic switching-off means actuating said relay control means to disconnect said power supply and said amplifier means when loop current in said apparatus is interrupted;
    whereby short duration, less than said predetermined timing period, depression of said non-latching button turns said amplifier on and off by connecting and disconnecting said power supply and said amplifier, and depression of said non-latching button for greater than said predetermined timing period adjusts the volume of said amplifier through said volume control means.

2. Apparatus according to claim 1 wherein said relay control means further comprises:
    counter means having an output, an enable input, a reset input, and a clock input;
    current amplifier means having an input connected to said counter output, and a current amplifier output;
    relay means having a relay input and a relay return, said return connected to a return terminal of said power supply;
    first capacitor means connected to said current amplifier and said relay input;
    first diode means having an anode and a cathode, said cathode connected to said counter enable input, and said anode connected to said counter output;
    first resistor means connected between said counter reset input and said power supply return terminal;
    first inverter means having an input and an output and being coupled to said clock input;
    second capacitor means connecting said first inverter output and said counter clock input; and
    second resistor means connected to said counter clock input and said power supply return.

3. Apparatus according to claim 1 wherein said automatic switching-off means further comprise:
    a PNP transistor having a base, collector and an emitter, said collector connected to said counter reset input;
    a second diode having an anode and a cathode, said cathode connected to said PNP transistor base and said anode connected to a positive source lead of said power supply;
    a third capacitor connected to said PNP transistor base and said return of said power supply;
    a third diode having an anode and a cathode, said cathode connected to said PNP transistor emitter, and said anode connected to a first relay contact; and p1 a fourth capacitor connected to said PNP transistor emitter and said return of said power supply.

4. Apparatus according to claim 4 wherein said time delay means comprises:
    a second inverter means having an input and an output, said output being a second logic state;
    a third capacitor means connected to said second inverter means input and to said power supply return;

a third resistor means connected to said first inverter means output which provides a first logic state delayed from said second logic state, said third resistor also being connected to said second inverter input; and a fourth resistor means connected to said second inverter means output and to said counter enable input.

5. Apparatus according to claim 2 wherein said volume control means comprises:
   a second counter means having a first, a second, a third and a fourth output, a clock input, and enable input, and a counter reset;
   a FED regulating transistor means having a gate, a source and a drain, said source being connected to said amplifier and said drain being connected to some signal source to be adjusted in amplitude;
   a resistor summing network means comprising four summing resistors each being connected to one of said first, second, third and fourth counter output, and each said summing resistor being connected to said FED transistor gate providing a stepwise increasing signal to said FED transistor gate; and
   a third resistor means and a smoothing capacitor means each connected to said FED transistor gate and said third resistor connected to said source lead of said power supply and said smoothing capacitor connected to said return lead of said power supply, to provide smoothing of said stepwise increasing signal.

6. Apparatus according to claim 1, wherein said relay control means comprises:
   a first binary counter having an output, and enable, clock and reset inputs;
   at least two transistors connected to said counter output in a balanced circuit for current amplification;
   a first diode connected from said output to said enable input;
   a first capacitor and a bipolar relay connected to the output of said current amplifier circuit;
   a first resistor connected to said reset input; and
   a second capacitor, a second resistor and first inverter means connected to said clock input.

7. Apparatus according to claim 6 wherein said automatic switching off means comprises:
   a transistor;
   a second diode and a third capacitor connected to the base of said transistor;
   a third diode and a fourth capacitor connected to the emitter of said transistor;
   the collector of said transistor being connected to said relay control means to provide a reset signal thereto.

8. Apparatus according to claim 6, wherein said time delay means comprises:
   a first series circuit comprising a third resistor and a third capacitor; and
   a second series circuit comprising a fourth resistor and a second inverter, said second series circuit being connected between said first series circuit and said relay control means to provide an enable signal thereto.

9. Apparatus according to claim 6 wherein said volume control means comprises:
   a second binary counter having a plurality of outputs, and enable, clock and reset inputs;
   pulse generator means connected to said second counter enable input, said pulse generator means comprising a square wave generator and third and fourth resistors and a third capacitor;
   a NAND gate operating as a function of said time delay means connected between said time delay means and said pulse generator, said NAND gate being adapted to release said second counter through said enable input;
   means connecting said relay control means and said second resistor to said reset input of said second counter;
   an output resistor connected to each of said outputs of said second counter;
   a regulating transistor having gate, source and drain terminals, said output resistors being connected to said gate terminal to produce a stepwise voltage increase at said gate terminal;
   a smoothing capacitor and a fifth resistor connected to said gate terminal to smooth said voltage applied to said gate; and
   a source resistor connected to said source terminal, said source terminal being connected to said amplifier means.

10. Apparatus according to claim 1 wherein said automatic switching off means comprises:
    a transistor;
    a first diode and a first capacitor connected to the base of said transistor;
    a second diode and a second capacitor connected to the emitter of said transistor;
    the collector of said transistor being connected to said relay control means to provide a reset signal thereto.

11. Apparatus according to claim 1 wherein said time delay means comprises:
    a first series circuit comprising a first resistor and a first capacitor; and
    a second series circuit comprising a second resistor and a second inverter, said second series circuit being connected between said first series circuit and said relay control means to provide an enable signal thereto.

12. Apparatus according to claim 1 wherein said volume control means comprises:
    a binary counter having a plurality of outputs, and enable, clock and reset inputs;
    pulse generator means connected to said binary counter enable input, said pulse generator means comprising a square wave generator and first and second resistors and a first capacitor;
    a NAND gate operating as a function of said time delay means connected between said time delay means and said pulse generator means, said NAND gate being adapted to release said counter through said enable input;
    means connecting said relay control means and a third resistor to said reset input of said binary counter;
    an output resistor connected to each of said outputs of said binary counter;
    a regulating transistor having gate, source and drain terminals, said output resistors being connected to said gate terminal to produce a stepwise voltage increase at said gate terminal;
    a smoothing capacitor and a fourth resistor connected to said gate terminal to smooth said voltage applied to said gate; and
    a source resistor connected to said source terminal, said source terminal being connected to said amplifier means.

* * * * *

UNITED STATES PATENT AND TRADEMARK OFFICE
CERTIFICATE OF CORRECTION

PATENT NO. : 4,384,260
DATED : May 17, 1983
INVENTOR(S) : Klaus Hornburg

It is certified that error appears in the above-identified patent and that said Letters Patent are hereby corrected as shown below:

Column 4, Claim 3, line 59 - delete "pl".

Column 4, Claim 4, line 62, change "4" to --2--.

Signed and Sealed this

Sixteenth Day of August 1983

[SEAL]

Attest:

GERALD J. MOSSINGHOFF

Attesting Officer  Commissioner of Patents and Trademarks